(12) United States Patent
Heggemann et al.

(10) Patent No.: US 7,666,005 B2
(45) Date of Patent: Feb. 23, 2010

(54) HOUSING FOR ELECTRICAL COMPONENTS

(75) Inventors: Christian Heggemann, Detmold (DE);
Jens Oesterhaus, Detmold (DE);
Matthias Boensch, Bielefeld (DE);
Matthias Niggemann, Doerentrup (DE);
Michael Lenschen, Detmold (DE);
Stephan Fehling, Lage (DE); Torsten Diekmann, Leopoldshoehe (DE)

(73) Assignee: Weidmuller Interface GmbH & Co. KG, Detmold (DE)

( * ) Notice: Subject to any disclaimer, the term of this patent is extended or adjusted under 35 U.S.C. 154(b) by 0 days.

(21) Appl. No.: 12/320,854

(22) Filed: Feb. 6, 2009

(65) Prior Publication Data

US 2009/0207571 A1    Aug. 20, 2009

(30) Foreign Application Priority Data

Feb. 14, 2008    (DE) .................. 20 2008 002 113 U

(51) Int. Cl.
*H01R 12/00* (2006.01)
(52) U.S. Cl. ...................... 439/76.1; 439/716; 439/535; 361/752; 361/730; 361/747
(58) Field of Classification Search ............... 439/76.1, 439/716, 535; 361/752, 730, 747
See application file for complete search history.

(56) References Cited

U.S. PATENT DOCUMENTS

| 5,469,332 | A | * | 11/1995 | Alvite | .................. | 361/737 |
| 6,392,319 | B1 | * | 5/2002 | Zebermann et al. | ......... | 307/147 |
| 6,456,495 | B1 | * | 9/2002 | Wieloch et al. | ............. | 361/729 |
| 6,582,031 | B2 | * | 6/2003 | Newton et al. | ................ | 303/20 |

* cited by examiner

*Primary Examiner*—Gary F. Paumen
(74) *Attorney, Agent, or Firm*—Lawrence E. Laubscher, Sr.; Lawrence E. Laubscher, Jr.

(57) ABSTRACT

A connector assembly for a planar vertical printed circuit board includes a housing having a pair of parallel space planar vertical side walls defining an open-topped vertical chamber in which the printed circuit board is mounted. First electrical connectors mounted on the vertical end edges of the printed circuit board include body portions that extend outward beyond the vertical edges of the side walls, which extending body portions contain access openings affording communication with first connector contacts in electrical engagement with the printed circuit board. Protective side cover members are fastened to the housing side walls to partially enclose the extending connector body portions, which cover members contain openings opposite the connector body access openings. The cover members contain ventilation openings for cooling the printed circuit board, and the housing includes a mounting foot arrangement for mounting the printed circuit board assembly on a support rail.

15 Claims, 5 Drawing Sheets

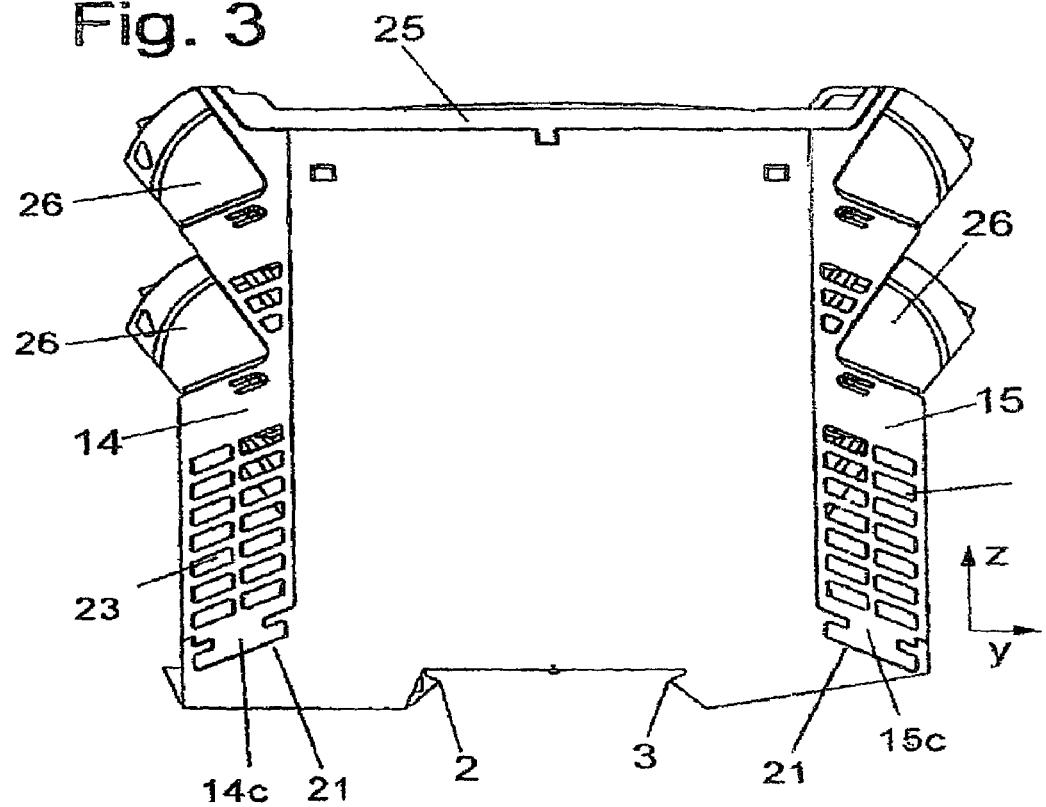
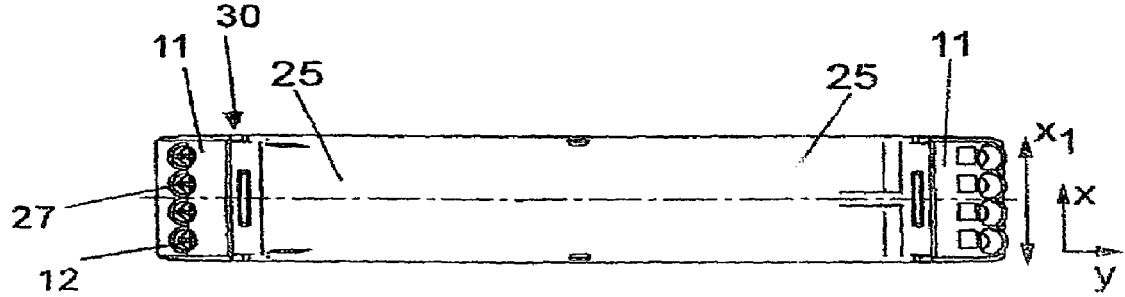

HOUSING FOR ELECTRICAL COMPONENTS

REFERENCE TO RELATED APPLICATIONS

This application is related to the Heggemann et al applications Ser. No. 12/322,673 filed Feb. 5, 2009 entitled "Electronic Housing With a Conductive Plate, and Method for Manufacturing the Same", Ser. No. 12/320,856 filed Feb. 6, 2009 entitled "Connector Apparatus With Code Means, and Method of Assembling the Same", and Ser. No. 12/322,889 filed Feb. 9, 2009 entitled "Stackable Electronic Housing With Male or Female Connector Strips".

BACKGROUND OF THE INVENTION

1. Field of the Invention

A connector assembly for a planar vertical printed circuit board includes a housing having a pair of parallel space planar vertical side walls defining an open-topped vertical chamber in which the printed circuit board is mounted. First electrical connectors mounted on the vertical end edges of the printed circuit board include body portions that extend outwardly beyond the vertical edges of the side walls, which extending body portions contain access openings affording communication with first connector contacts in electrical engagement with the printed circuit board. Protective side cover members are fastened to the housing side walls to partially enclose the extending connector body portions, which cover members contain openings opposite the connector body access openings.

2. Description of Related Art

This invention relates to an electronic housing that permits the mounting of a plurality of printed circuit boards in series on a mounting rail. Such electronic housings are known as such but require further design improvement, in particular, regarding assembly and adaptability to differing connection techniques and unit sizes.

The present invention was developed to solve this problem by mounting a plurality of connectors vertically on the vertical end edges of the printed circuit board arranged in a housing chamber, which connectors are of the multi-contact type. To protect the portions of the connectors that protrude beyond the vertical edges of the side walls, protective side cover members are fastened to the housing side walls to partially enclose and to protect the protruding portions of the connectors.

In this way it is possible to adapt the electronic housing in a simple manner to different connection techniques. In each particular case, it is not necessary to design the complete housing anew; it is merely necessary to create differing side parts. It is furthermore possible in a simple manner, by varying the protective side cover members, to arrange two or more mutually parallel printed circuit boards in the housing, or to insert them with preassembled side parts simply as a unit into a housing chamber. Furthermore, for example, by changing the side cover parts or by the use of different side covers, one can provide electronic housings with more or less intensive ventilation function or cooling function.

Preferably, on the at least one cover member or on the printed circuit board, there are arranged multi-contact plugs, and the side cover parts can be fastened upon the plugs. In this way, one can clearly simplify assembly, because the multi-contact plugs and the side cover parts are preassembled on the printed circuit board and this sensitive component is well protected during assembly in the housing chamber. In this way, at least one printed circuit board, together with the multi-contact plugs and the side covers, form a preassembled unit which can be inserted into the housing chamber.

In a preferred manner, the multi-contact plugs are made as pin contact strips or as socket boards. Other models are conceivable, for example, as RJ45-plug or socket.

SUMMARY OF THE INVENTION

Accordingly, a primary object of the present invention is to provide a printed circuit board connector assembly in which a pair of parallel spaced planar side walls are connected to define an open-topped chamber for receiving a printed circuit board having a plurality of first electrical connectors mounted on the vertical edges thereof, together with two side protector members mounted on the vertical edges of the housing side walls to cover portions of the connectors that extend outwardly from the printed circuit board beyond the vertical end edges of the side walls.

According to a more specific object of the invention, the cover members each have a U-shaped horizontal cross-sectional configuration, thereby to define a pair of leg portions that extend on both sides of the associated protruding connector portion, and fastener means connect the extremities of the leg portions to the housing side walls.

A further object is to provide in the vertical end edges of the printed circuit board a plurality of vertically arranged recesses that define a sawtooth pattern, the connectors being arranged in these recesses, respectively, with their longitudinal axes being inclined at an acute angle to the vertical. The cover members have similar sawtooth recesses in which are received the mating connector parts that are connected with the first connector parts contained between the leg portions of the cover members.

BRIEF DESCRIPTION OF THE DRAWINGS

Other objects and advantages of the invention will become apparent from a study of the following specification, when viewed in the light of the accompanying drawing, in which:

FIG. 3 is a side view of the assembly with both connector components being illustrated in the connected condition;

FIG. 4 is a top plan view of the apparatus of FIG. 1;

DETAILED DESCRIPTION OF THE INVENTION

Figure 1:
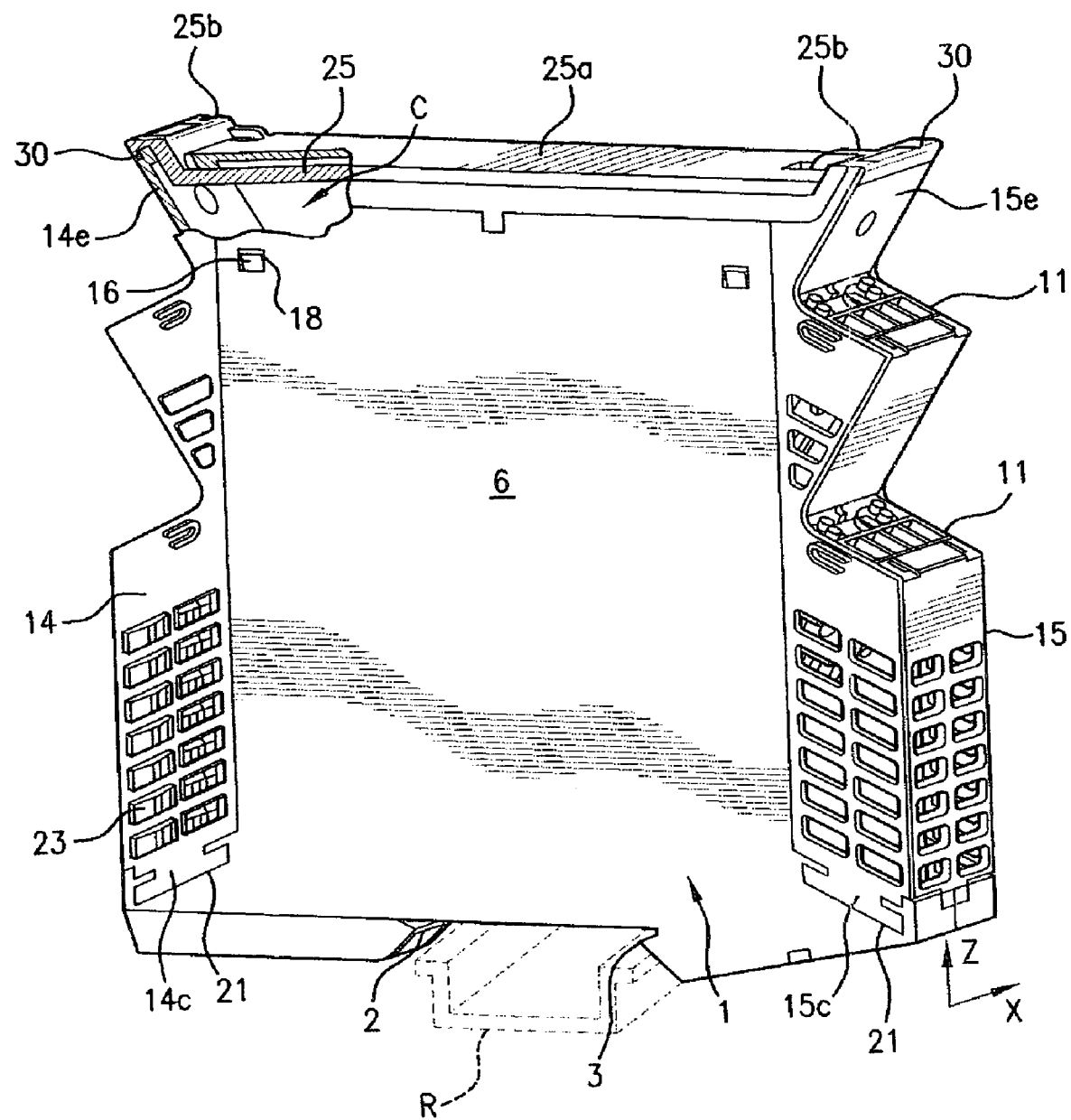
FIG. 1 is a somewhat diagrammatic perspective representation of the printed circuit board connector assembly according to the present invention.
Figure 5:
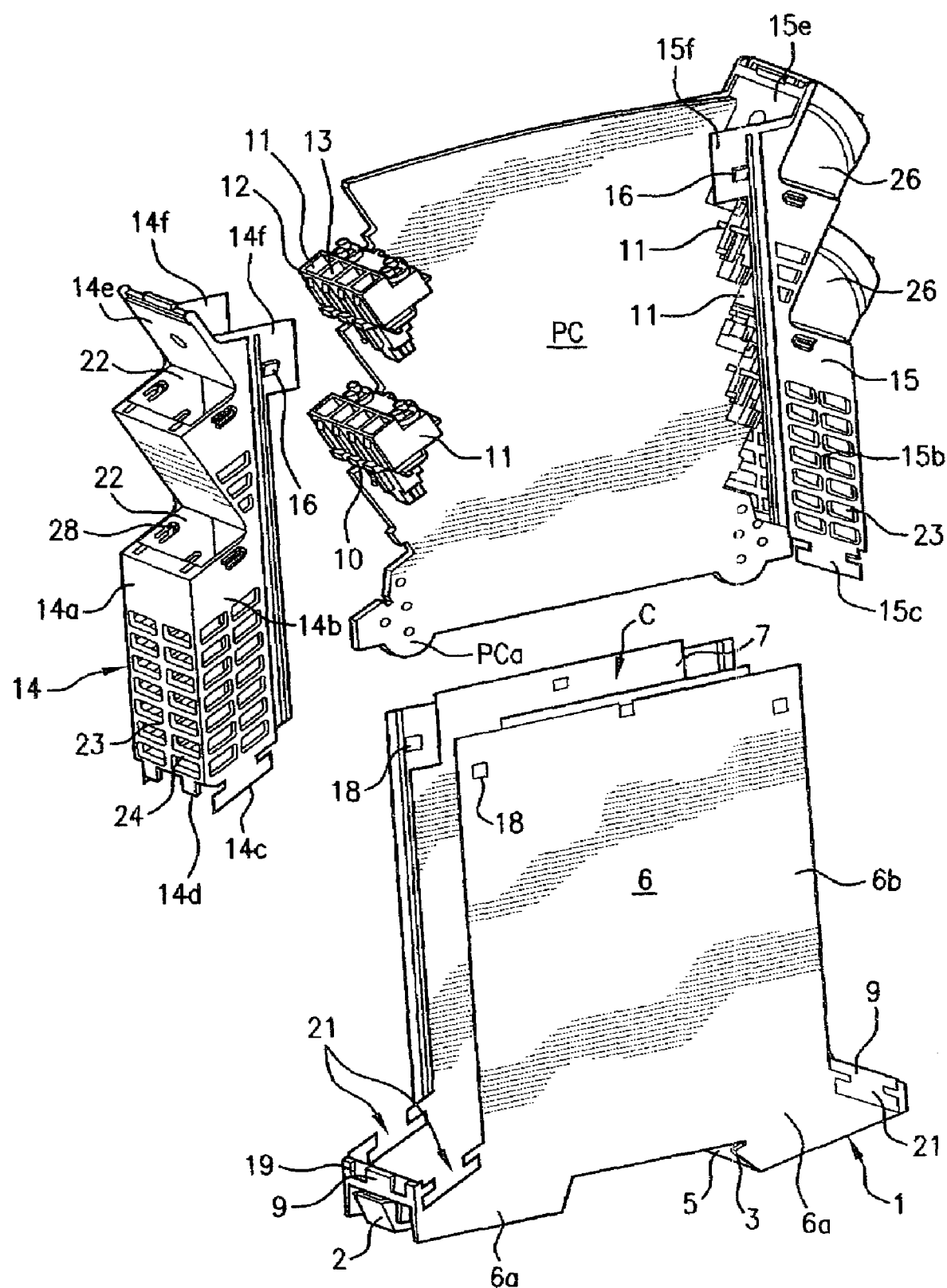
FIG. 5 is an exploded view of the apparatus of FIG. 3.

Referring first more particularly to FIGS. 1 and 5, the printed circuit board connector assembly of the present invention includes a housing 1 provided with foot means 2 and 3 for mounting the housing upon a conventional support rail R. The housing includes vertical planar spaced parallel front and rear walls 6 and 7 that are connected by transverse end walls 9 (FIG. 5) to define an open-topped chamber C for receiving a printed circuit board PC. Two protective cover members 14 and 15 are fastened to the ends of the housing side walls 6 and 7 to protectively cover the protruding portions of a plurality of connector components 11 that are mounted in recesses 10 contained in the vertical end edges of the printed circuit board PC, as best shown in FIG. 5. The top of the chamber C is closed by a top wall 25 having a horizontal portion 25a extending across the chamber, and a pair of end portions 25b that are connected by locking connections 30 with the upper extremities 14c and 15c of the side cover members 14 and 15.

Figure 2:
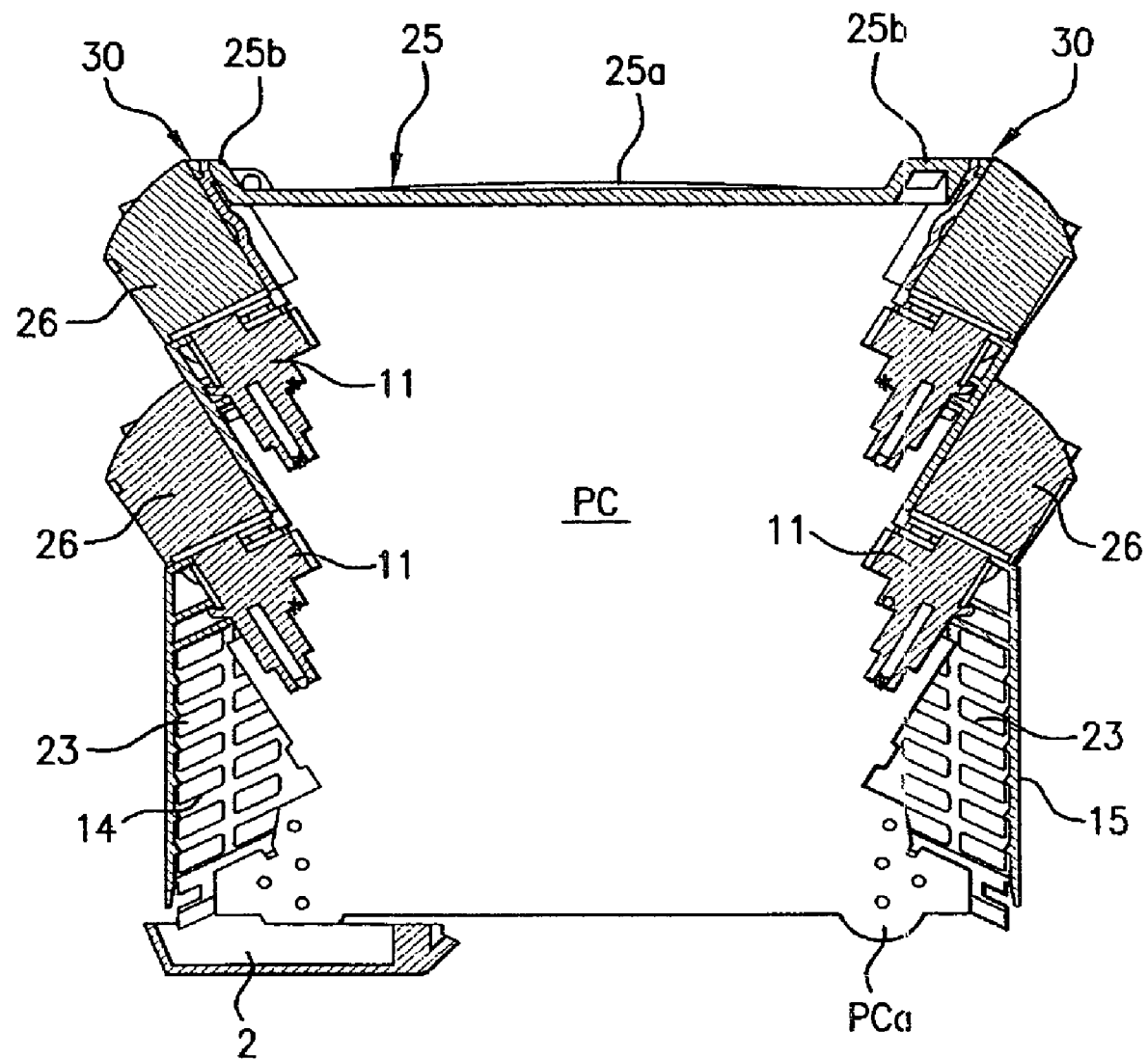
FIG. 2 is a perspective diagrammatic view of the printed circuit board and connector assembly, with certain parts removed.

As shown in FIG. 2, the printed circuit board PC has foot portions PCa that extend within the mounting feet 2 and 3, respectively. The protective side cover members 14 contain openings 22 (FIG. 5) that provide access to the contacts 27 of the first connector components 11, as shown in FIG. 4. Ventilation openings 23 contained in the protective side cover members 14 and 15 permit the flow of cooling air toward the printed circuit board PC and the components mounted thereon.

The protective side cover members 14 and 15 each have a generally U-shaped cross-sectional configuration defining a transverse portion 14a and 15a that extends normal to the planes of the side walls 6 and 7, and a pair of parallel leg portions 14b and 15b that extend parallel with the side walls on opposite sides of the connector components 11. A plurality of fastening means are provided for fastening the protective cover members 14 and 15 to opposite ends of the vertical side walls 6 and 7. First, the leg portions 14b and 15b of the cover members are provided with downwardly extending integral locking tab portions 14c and 15c that engage corresponding locking recesses 21 defined in the enlarged side wall portions 6a and 7a arranged at the base of the side walls 6 and 7. Thus, the side walls have a generally inverted T-shaped configuration including enlarged base portions 6a and 7a, and a narrower upper vertical portion 6b and 7b. Second cover fastening means are defined by the integral projections 14d and 15d that extend downwardly from the transverse portions 14a and 15a into corresponding locking slats 19 contained in the transverse housing side walls 9. Finally, at their upper ends, the cover members are provided with integral tab portions 14f and 15f that are resiliently biased outwardly to effect engagement between the integral projections 16 carried thereby and the corresponding respective openings 18 contained in the side walls 6 and 7, thereby to fasten the upper ends of the protective cover members to the housing side walls. Finally, the top wall 25 has end portions 25b that are locked to the upper end portions 14e and 15e of the cover members by the locking means 30.

Figure 6:
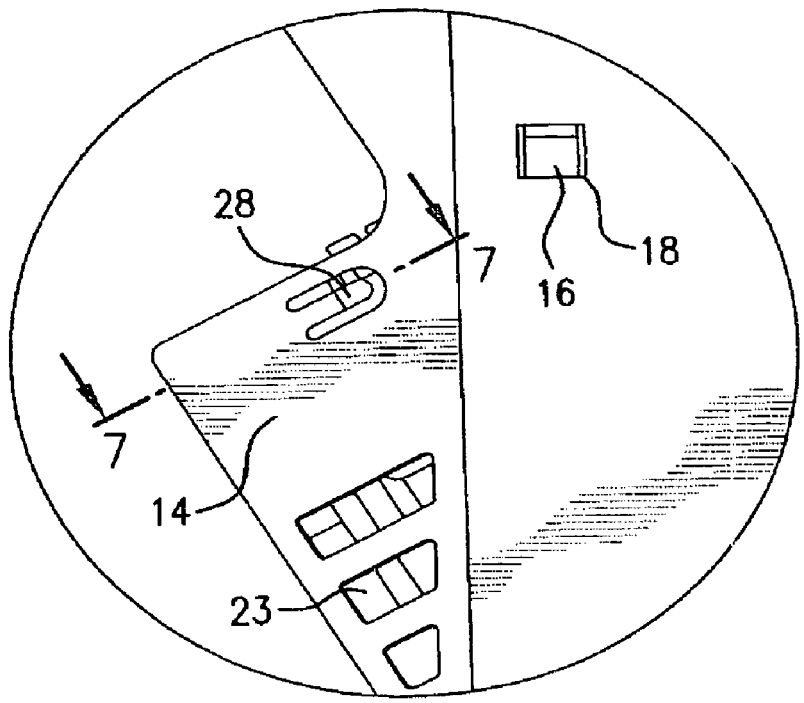
FIG. 6 is a detailed view illustrating one on the fastening means for fastening the protective cover member to the housing.
Figure 7:
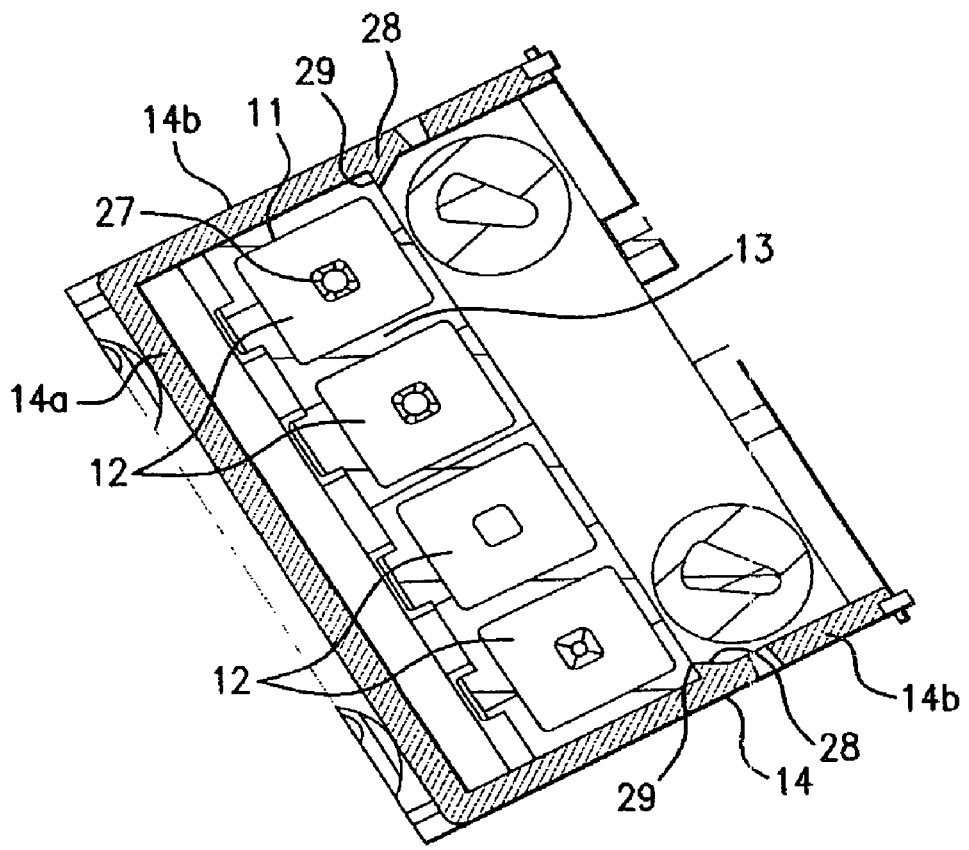
FIG. 7 is a sectional view taken along line 7-7 of FIG. 6.

As shown in FIGS. 6 and 7, the cover members 14 and 15 are provided with partially punched out catch projections 28 that engage edge portions 29 of the connector members 11 that are mounted on the printed circuit board, such that the projections 28 snap behind the edges 29 of the components to further fasten the cover members to the assembly.

Referring again to FIG. 5, it will be noted that the printed circuit board PC has vertical end edges that contain stepped recesses which define a sawtooth configuration, whereby when the connector components 11 are mounted in the recesses, the longitudinal axes of the connector components are angularly arranged to the vertical longitudinal axis of the printed circuit board PC.

As shown in FIG. 7, the first connector component 11 contains a plurality of laterally spaced chambers 12 that are arranged transversely of the plane containing the printed circuit board PC. The male contact pins 12 (or corresponding female contacts) extend upwardly for engagement with corresponding female or male contacts carried by the companion socket component 26. Thus, in accordance with the present invention, the connector portions that extend outwardly from the chamber C beyond the vertical edges of the side walls 6 and 7 are protected by the cover members 14 and 15 that are fastened to the sides of the housing assembly 1. While the cover members are preferably formed from a suitable electrically insulating synthetic plastic material, it is possible that these could be formed from metal.

It is important to note that the unit consisting of the printed circuit board PC with the connector components 11 mounted thereon, as shown in FIG. 5, may be inserted downwardly into the open-top chamber C, whereupon the protective side cover members 14 and 15 are fastened to the side walls 6 and 7, and the top wall 25 is locked across the top of the housing, thereby to lock the upper portions of the cover members together with the housing side walls 6 and 7.

The width of the assembly 1 is on the order of 12.5 mm or more, and a rugged unit is provided that is suitable for mounting upon a mounting rail R. In addition to the ventilation openings 23 in the cover members 14 and 15, openings 5 my be provided in the foot portions of the housing. Also, the cover members may also include cooling ribs 24 or the like for dissipating heat from the printed circuit board. If desirable, two or more printed circuit boards PC could be mounted in the chamber C.

Following the insertion of one or more printed circuit boards PC into the chamber C, the housing 1 is closed at the top by a top wall 25 that preferably can be fixed in a locking manner upon the side parts 14, 15 and upon the main side walls 5, 6. According to FIG. 1, this locking action by locking means 30 preferably is made in the manner of a clamp that grasps from the outside behind the side part 14, 15 (in the Y-direction), so that top wall 24 will prevent the protective cover parts 14, 15 from being pulled apart, normal to the mounting rail (in the Y-direction). Top wall 25 can also receive additional connections and/or can be used for marking indicia purposes.

Preferably, the housing extends over 12.5 mm or more in the direction of the mounting rail. Here it is conceivable to design the electronic housing 1 in such a manner that can receive two or more printed circuit parts LP (not shown). While the protective cover members 14, 15 in this case are so designed that the pin strips can be contacted on them and the recesses 22 can also be so designed that other connections can be reached through them, for example, plugs in the RJ45-format, light-conducting plugs or plugs or sockets of a different kind. By virtue of the sawtooth configuration of the recesses formed on the vertical end edges of the printed circuit, it is possible to build relatively high in the vertical direction normal to the mounting rail, which is advantageous because, in that direction, the structural space is mostly rather less confined.

While in accordance with the provisions of the Patent Statutes the preferred forms and embodiments of the invention have been illustrated and described, it will be apparent to those skilled in the art that changes may be made without deviating from the invention described above.

What is claimed is:

1. A printed circuit board connector assembly, comprising:
   (a) a generally rectangular housing (1) including:
      (1) a pair of planar generally-rectangular vertical front (6) and rear (7) side walls connected together in parallel spaced relation, said side walls having vertical end edges; and
      (2) mounting foot means (2, 3) adjacent the bottom edge portions of said side walls for mounting said housing on a support rail (R), said side walls being connected together to define an open-topped vertical chamber (C);
   (b) a generally rectangular planar circuit board (PC) mounted in said chamber between and parallel with said housing side walls, said printed circuit board including a base layer, and at least one conductive circuit mounted on at least one surface of said base layer, said printed circuit board having a pair of vertical end edges;

(c) first electrical connector including:
  (1) a first connector body (11) mounted on one of said printed circuit board vertical end edges; and
  (2) a first contact (27) carried by said connector body in electrical engagement with said printed circuit board conductive circuit,
  (3) at least a portion of said first connector body extending outwardly from said housing chamber beyond the associated vertical end edges of said side walls, said outwardly extending body portion containing an access opening (12) affording communication with said first contact; and (d) protective cover means partially enclosing said first electrical connector, said protective cover means comprising:
  (1) a side cover member (14, 15) containing an opening (22) opposite said first connector housing opening; and
  (2) fastening means fastening said side cover member with said housing side walls.

2. A printed circuit board connector assembly as defined in claim 1, and further including:
  (e) second connector means (26) mounted on said protective side cover adjacent said first connector means, said second connector means having a second contact in electrical engagement with said first contact.

3. A printed circuit board connector assembly as defined in claim 1, wherein said side cover member has generally U-shaped cross-sectional configuration defining a vertical transverse portion (14a, 15a) arranged normal to the planes of said side walls and spaced from the adjacent side wall vertical edges, respectively, and a pair of generally parallel leg portions (14b, 15b) extending from said transverse portion parallel with said side walls on opposite sides of said first connector means, respectively; and further wherein said fastening means includes:
  (a) first fastening means fastening said cover leg portions with said housing side walls, respectively.

4. A printed circuit board connector assembly as defined in claim 3, wherein said housing side walls have a generally inverted T-shaped configuration with enlarged bottom portions (6a, 7a) extending outwardly from vertical top portions (6b, 7b); and further wherein said first fastening means comprises an integral locking tab portion (14c, 15c) extending downwardly from the lower edge of each of said protective cover leg portions into a corresponding locking recess (21) contained in said housing side wall bottom portion.

5. A printed circuit board connector assembly as defined in claim 4, wherein said housing further includes a pair of end walls (9) connecting together the side wall enlarged bottom portions: and wherein said fastener means further includes:
  (b) second fastening means (14d, 15d, 19) fastening the bottom edge of said cover transverse portion with the associated housing end wall.

6. A printed circuit board connector assembly as defined in claim 5, wherein said fastening means includes:
  (c) third fastening means (16, 18) fastening the upper edge portions of said cover leg portions with adjacent portions of the housing side walls, respectively.

7. A printed circuit board connector assembly as defined in claim 3, and further including clasp means (28, 29) connecting said cover member leg portions with said first connector body.

8. A printed circuit board connector assembly as defined in claim 3, wherein said assembly includes a plurality of said first electrical connector means, at least one of said first electrical connector means being mounted on each of said printed circuit board vertical edges; and further including a pair of said protective cover members mounted at the ends of said housing, respectively, for partially enclosing the associated first electrical connector means.

9. A printed circuit board connector assembly as defined in claim 8, wherein the transverse portions of said protective side cover members have upper ends (14e, 15e) that terminate adjacent the upper edges of the housing side walls, respectively; and further wherein said housing includes:
  (3) a horizontal top wall (25) closing the upper end of said housing chamber; and
  (4) locking means (30) locking the ends of said top wall to said cover transverse wall upper ends.

10. A printed circuit board connector assembly as defined in claim 9, wherein each of said printed circuit board vertical edges contains a plurality of vertically spaced recesses that cooperate to define a sawtooth configuration; and further wherein one said first connector means is arranged in each of said recesses with the axes of said first connector bodies being inclined at an acute angle to the vertical.

11. A printed circuit board connector assembly as defined in claim 10, wherein said cover member transverse and leg portions contain a plurality of ventilation openings (23).

12. A printed circuit board connector assembly as defined in claim 11, and further wherein said cover members include cooling bodies for removing heat from said printed circuit board.

13. A printed circuit board connector assembly as defined in claim 3, wherein each of said first connector means includes a series of first contacts (27) arranged in a plane normal to the planes of said side walls.

14. A printed circuit board connector assembly as defined in claim 13, wherein said first contacts comprise pin contacts.

15. A printed circuit board connector assembly as defined in claim 13, wherein said first contacts comprise female contacts.

* * * * *